(12) United States Patent
Lee et al.

(10) Patent No.: US 10,879,340 B2
(45) Date of Patent: Dec. 29, 2020

(54) TILING DISPLAY DEVICE

(71) Applicant: LG Display Co., Ltd., Seoul (KR)

(72) Inventors: Seungjae Lee, Paju-si (KR); Jungwoo Ha, Paju-si (KR); Yoowhan Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/552,228

(22) Filed: Aug. 27, 2019

(65) Prior Publication Data

US 2020/0091273 A1 Mar. 19, 2020

(30) Foreign Application Priority Data

Sep. 14, 2018 (KR) .................. 10-2018-0110536

(51) Int. Cl.
*H01L 27/32* (2006.01)
*G09G 3/3266* (2016.01)
*G09G 3/3275* (2016.01)
*G09G 3/3233* (2016.01)

(52) U.S. Cl.
CPC ....... *H01L 27/3293* (2013.01); *G09G 3/3233* (2013.01); *G09G 3/3266* (2013.01); *G09G 3/3275* (2013.01); *G09G 2300/026* (2013.01); *G09G 2300/0408* (2013.01)

(58) Field of Classification Search
CPC .................. H01L 27/3293; G09G 3/3233
See application file for complete search history.

(56) References Cited

U.S. PATENT DOCUMENTS

| 2007/0145383 A1* | 6/2007 | Rho ............... H01L 25/0753 257/79 |
| 2008/0105073 A1* | 5/2008 | Sawai .............. F16M 11/10 74/425 |
| 2015/0160766 A1* | 6/2015 | Park .............. G09G 3/3677 345/173 |
| 2018/0089491 A1* | 3/2018 | Kim ............... G06K 9/00912 |
| 2020/0051966 A1* | 2/2020 | Lee ................. H01L 25/18 |

\* cited by examiner

*Primary Examiner* — Thao X Le
*Assistant Examiner* — Xia L Cross
(74) *Attorney, Agent, or Firm* — Morgan, Lewis & Bockius LLP

(57) ABSTRACT

A tiling display device includes a plurality of display modules arranged on one plane. The display module includes a substrate, a signal line, an open hole, a filling layer, and a circuit board. The substrate has a display area in which subpixels are defined. The signal line is positioned on the top surface of the substrate within the display area to deliver a predetermined signal to the subpixels. The open hole is provided to penetrate the substrate within the display area. The filling layer fills the open hole. The circuit board is positioned on the back surface of the substrate and electrically connected to the signal line through the filling layer.

9 Claims, 22 Drawing Sheets

TILING DISPLAY DEVICE

This application claims the priority benefit of Korean Patent Application No. 10-2018-0110536 filed on Sep. 14, 2018, which is incorporated herein by reference for all purposes as if fully set forth herein.

BACKGROUND

Technical Field

The present invention relates to a tiling display device.

Discussion of the Related Art

As the information technology is developed, the market of a display device, that is, a connection medium between a user and information, grows larger, and importance thereof increases. Accordingly, various types of display devices, such as an organic light-emitting diode (OLED) display, a liquid crystal display (LCD), and a plasma display panel (PDP), are developed and put to practical use.

Such display devices may be used as display devices having a relatively small size, such as TV, monitors, and various personal portable digital devices, and may be used as display devices having a relatively large size, such as a public display and a digital signage.

The large-sized display device is commonly positioned outdoors and used to provide information to multiple users. Accordingly, the large-sized display device needs to be implemented to have a large area so that users can easily recognize information provided by the display device even at a remote place.

However, although the fabrication technology has been developed, the area of a display device that may be fabricated using one sheet of a base substrate is limited. That is, if a large area display device is fabricated using one sheet of a base substrate, there is a difficulty in securing the yield of a given level or more.

Furthermore, in view of the situation in which a fabrication environment significantly changes in accordance with an increase in the area of a display device, there are problems in that a new fabrication environment must be constructed and a manufacturing cost is increased in order to fabricate a large area display device using one base substrate.

In order to solve the above problems, there is proposed a method of implementing a large area display device by combining a plurality of display modules having a maximum area, which can be fabricated using a current stabilized technology. For example, a large area display device may be implemented by arranging four display modules on one plane in parallel and fixing adjacent display modules. A large area display device implemented by such a method may be called a tiling display device.

Each of display modules includes a display area and a bezel area outside the display area. A tiling display device includes bezel areas corresponding to the respective bezel areas of combined display modules because a plurality of divided display modules has a combined form. Such a bezel area corresponds to an area in which an image is not implemented, and thus reduces the esthetic characteristic and visibility of a display device. Furthermore, there is a problem in that a degree of immersion into an image may be significantly reduced because the bezel area may provide a sense of disconnection and/or a sense of difference to a user who watches display devices if the bezel area is defined between the adjacent display devices. Accordingly, it is necessary to propose a method for minimizing the area occupied by the bezel area in providing a tiling display device.

SUMMARY

Accordingly, embodiments of the present disclosure are directed to a tiling display device that substantially obviates one or more of the problems due to limitations and disadvantages of the related art.

An aspect of the present disclosure is to provide a tiling display device having a reduced area occupied by a bezel area.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described, a tiling display device comprises a plurality of display modules arranged on one plane. The display module includes a substrate, a signal line, an open hole, a filling layer, and a circuit board. The substrate has a display area in which subpixels are defined. The signal line is positioned on the top surface of the substrate within the display area to deliver a predetermined signal to the subpixels. The open hole is provided to penetrate the substrate within the display area. The filling layer fills the open hole. The circuit board is positioned on the back surface of the substrate and electrically connected to the signal line through the filling layer.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain various principles. In the drawings.

DETAILED DESCRIPTION

Figure 1:
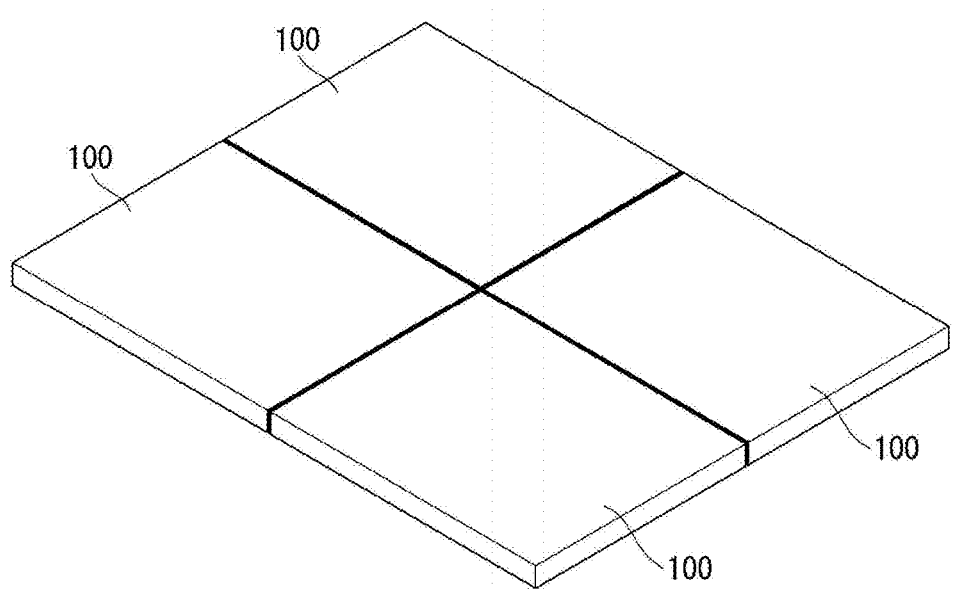
FIG. 1 is a perspective view schematically showing a tiling display device.

Hereinafter, example embodiments of the present invention are described with reference to the accompanying drawings. Throughout the specification, the same reference numeral substantially denotes the same element. In the following description, a detailed description of known technology or element related to the present invention will be omitted if it is deemed to make the gist of the present invention unnecessarily vague. In describing several embodiments, the same element is representatively described at the introductory part of this specification, and may be omitted in other embodiments.

Terms including ordinal numbers, such as the first and the second, may be used to describe various elements, but the elements are not limited by the terms. The terms are used to only distinguish one element from the other element.

Figure 2:
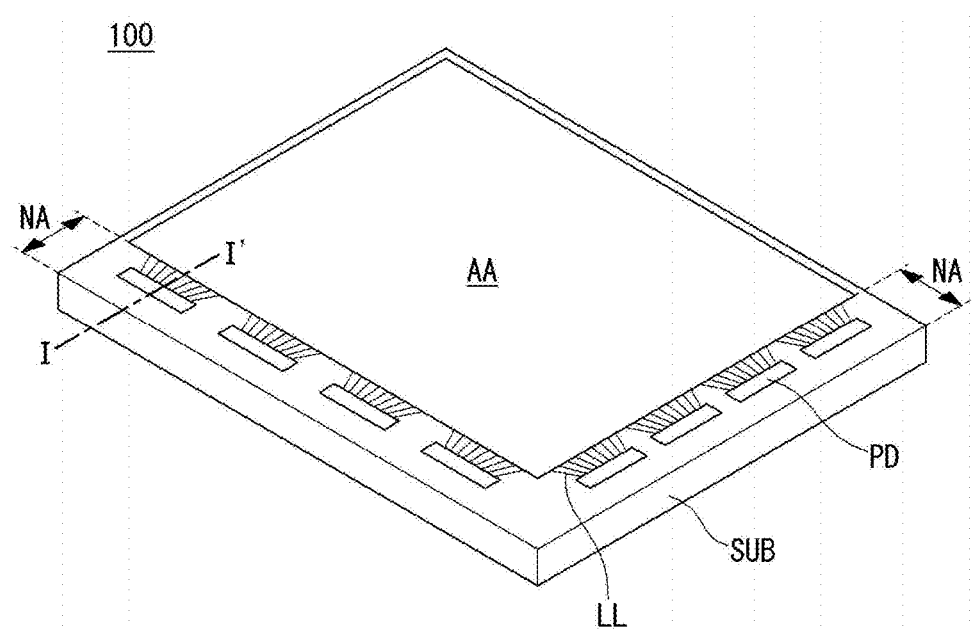
FIG. 2 is a perspective view showing an example of a display module configuring the tiling display device.
Figure 3:
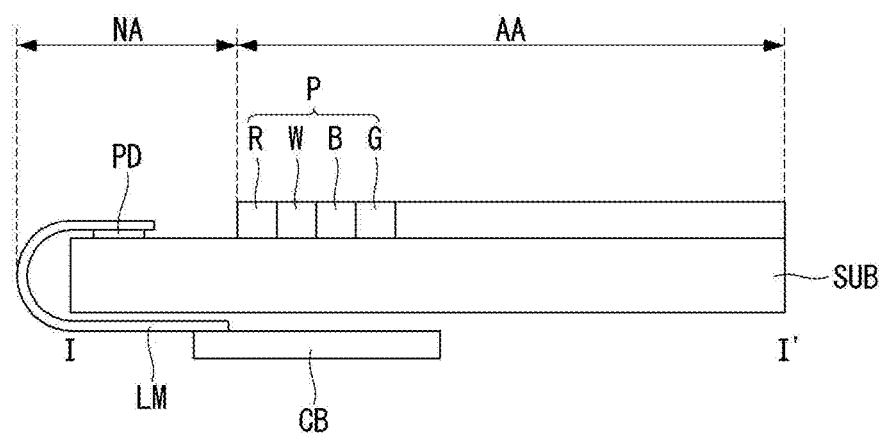
FIG. 3 is a cross-sectional view of FIG. 2 taken along line I-I'.

FIG. 1 is a perspective view schematically showing a tiling display device. FIG. 2 is a perspective view showing an example of a display module configuring the tiling display device. FIG. 3 is a cross-sectional view of FIG. 2 taken along line I-I'.

Referring to FIG. 1, the tiling display device includes n (n is an integer of 2 or more) display modules 100. The display modules 100 are arranged on one plane in parallel. That is, the display modules 100 are arranged in parallel so that respective display areas on which images are displayed are directed toward one direction.

The tiling display device may provide one image to a user through the plurality of display modules 100 arranged in parallel on a horizontal plane. That is, the user may recognize a piece of image information, provided by the tiling display device, through a large screen corresponding to the total area in which the display modules 100 have been combined. In some embodiments, a plurality of different images may be provided through the plurality of display modules 100 arranged in parallel on one plane.

In FIG. 1, four display modules 100 have been illustrated, but the present invention is not limited thereto. Furthermore, each of the display modules 100 configuring the tiling display device has been illustrated as having approximately the same area and shape, but is not limited thereto.

Each of the display modules 100 includes an OLED. The OLED includes an organic compound layer and an anode and a cathode facing each other with the organic compound layer interposed therebetween. The organic compound layer includes an emission layer EML, and may further include at least one common layer of a hole injection layer (HIL), a hole transport layer (HTL), an electron transport layer (ETL), and an electron injection layer (EIL).

Referring to FIGS. 2 and 3, the display module 100 includes a substrate SUB and a driving unit. A display area AA and a bezel area NA outside the display area are defined on the substrate SUB. The substrate SUB may be made of glass or a plastic material. For example, the substrate SUB may be made of a plastic material, such as polyimide (PI), polyethylene terephthalate (PET), polyethylene naphthalate (PEN) or polycarbonate (PC), and may have a flexible characteristic.

A plurality of pixels P is arrayed on the top surface of the display area AA of the substrate SUB. Although not shown, the display module 100 may further include an encapsulation layer. The encapsulation layer may be positioned to at least cover the display area AA in order to protect elements within the pixels against moisture and oxygen which may be introduced from the outside.

The pixel P includes a plurality of subpixels SP. In FIG. 3, the pixel P has been illustrated as including subpixels SP of red (R), white (W), blue (B), and green (G) sequentially arranged in one direction, but the present invention is not limited thereto. For example, the pixel P may be configured with subpixels SP of red (R), blue (B), and green (G). The array sequence of the subpixels SP may be changed in various ways depending on an emission material, an emission area, the configuration of a compensation circuit, etc.

Each of the subpixels SP includes an OLED emitting a corresponding color. The subpixel SP may be implemented as an active matrix (AM) method or may be implemented as a passive matrix (PM) method. Hereinafter, a case where the subpixel SP includes a transistor and is implemented as the AM method is described as an example, for convenience of description. Then OLED and the transistor may be connected to signal lines to which a predetermined signal is applied.

A pad part is positioned in the bezel area NA of the substrate SUB. The pad part includes a plurality of pads PD and link lines LL. The pads PD are connected to the signal lines of the display area AA, respectively, through the link lines LL. The link line LL is electrically connected to the driving unit through the pad PD and supplied with a driving signal, and it delivers the driving signal to a corresponding signal line of the display area AA.

The driving unit includes a data driver configured to supply subpixels SP with a data voltage of an input image, a gate driver configured to supply subpixels SP with a scan pulse synchronized with a data voltage, and a timing controller (T-CON) configured to control operating timing of the data driver and the gate driver.

The driving unit includes a link member LM on which a drive integrated circuit (IC) chip IC has been mounted and a circuit board CB. The drive IC chip IC may be a gate drive IC or a source drive IC. The link member LM may be implemented in a chip on film (COF) or tape carrier package (TCP) manner. The link member LM may have one end connected to the pad PD and the other end connected to the circuit board CB. The circuit board CB may be a gate printed circuit board (PCB) or a source PCB.

In a structure, such as FIG. 3, the area in which the pads PD are disposed and the area in which the link member LM bonded to the pads PD is positioned need to be separately allocated in the bezel area NA. In this case, the pads PD and the link member LM need to have predetermined areas in order to perform their own functions. For this reason, a reduction in the area of the bezel area NA by adjusting the areas of the pads PD and the link member LM is limited.

Figure 4:
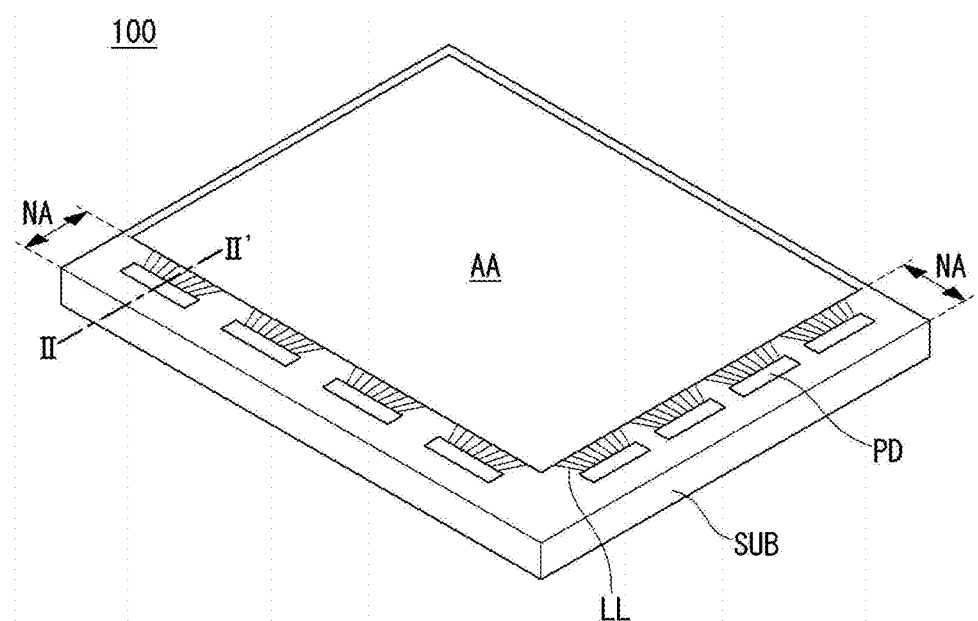
FIG. 4 is a perspective view showing another example of a display module configuring a tiling display device.
Figure 5:
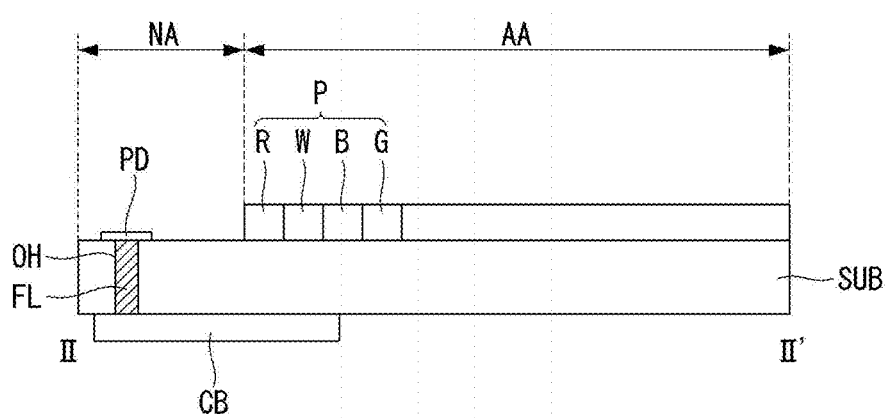
FIG. 5 is a cross-sectional view of FIG. 4 taken along line II-II'.

FIG. 4 is a perspective view showing another example of a display module configuring a tiling display device. FIG. 5 is a cross-sectional view of FIG. 4 taken along line II-II'.

Referring to FIGS. 4 and 5, the display module 100 includes a substrate SUB and a driving unit. A display area AA and a bezel area NA outside the display area AA are defined on the substrate SUB.

A plurality of pixels P is arrayed on the top surface of the display area AA of the substrate SUB. Each of the pixels P includes a plurality of subpixels SP. Each of the subpixels SP includes an OLED emitting a corresponding color and a transistor. The OLED and the transistor may be connected to signal lines to which a predetermined signal is applied.

A pad part is positioned in the bezel area NA of the substrate SUB. The pad part includes a plurality of pads PD and link lines LL. The pads PD are connected to the signal lines of the display area AA, respectively, through the link lines LL. The link line LL is electrically connected to the driving unit through the pad PD and supplied with a driving signal, and it delivers the driving signal to a corresponding signal line of the display area AA.

The driving unit includes a circuit board CB. The circuit board CB is positioned on the back surface of the substrate SUB. A drive IC chip may be mounted on the circuit board CB. Accordingly, the display module 100 may have a structure from which the link member LM has been deleted, unlike in the structures shown in FIG. 3.

The substrate SUB includes an open hole OH, formed in the bezel area NA, and a filling layer FL. The open hole OH is formed to penetrate the substrate SUB. The filling layer FL fills the inside of the open hole OH. The filling layer FL has one end connected to the pad PD or link line LL positioned on the top surface of the substrate SUB, and has the other end connected to the circuit board CB positioned on the back surface of the substrate SUB. The filling layer FL is made of a conductive material and electrically connects the pad PD and the circuit board CB, or the link line LL and the circuit board CB.

Compared to the structures shown in FIG. 3, the structure shown in FIG. 5 has a relatively narrow bezel area NA because the area in which the link member (LM, FIG. 3) is positioned does not need to be separately allocated. However, the minimization of the bezel area NA is limited because the pad part in which the open hole OH is formed needs to be separately allocated outside the display area AA.

First Embodiment

Figure 6:
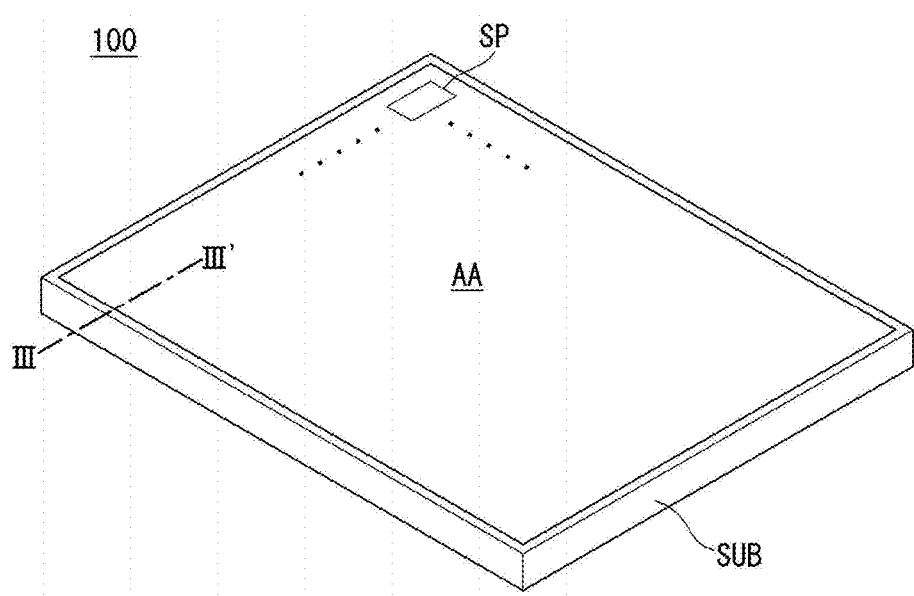
FIG. 6 is a perspective view showing a display module configuring a tiling display device according to a first embodiment of the present invention.
Figure 7:
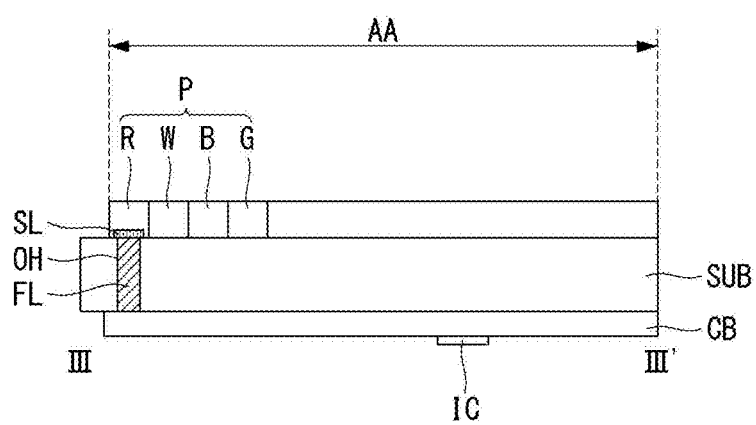
FIG. 7 is a cross-sectional view of FIG. 6 taken along line III-III'.

FIG. 6 is a perspective view showing a display module configuring a tiling display device according to a first embodiment of the present invention. FIG. 7 is a cross-sectional view of FIG. 6 taken along line III-III'.

Referring to FIGS. 6 and 7, the display module 100 includes a substrate SUB and a driving unit. A display area AA is defined on the substrate SUB. The first embodiment of the present invention can provide a tiling display device having a minimized bezel area NA because a separate pad part is not defined on the substrate SUB, unlike in the structures shown in FIGS. 2 to 5.

A plurality of pixels P is arrayed on the top surface of the display area AA of the substrate SUB. Each of the pixels P includes a plurality of subpixels SP. Each of the subpixels SP includes an OLED emitting a corresponding color and a transistor. The OLED and the transistor may be connected to signal lines SL to which a predetermined signal is applied. The signal lines SL are disposed within the display area AA.

The driving unit includes a circuit board CB. The circuit board CB is positioned on the back surface of the substrate SUB. A drive IC chip may be mounted on the circuit board CB. Accordingly, the display module 100 may have a structure from which the link member LM has been deleted, unlike the structure shown in FIG. 3.

The substrate SUB includes an open hole OH, formed in the display area AA, and a filling layer FL. The open hole OH is formed to penetrate the substrate SUB. The filling layer FL fills the inside of the open hole OH. The filling layer FL has one end connected to the signal line SL positioned on the top surface of the substrate SUB, and has the other end connected to the circuit board CB positioned on the back surface of the substrate SUB. The filling layer FL is made of a conductive material and electrically connects the signal line SL and the circuit board CB. One filling layer FL may connect a corresponding signal line SL and the output lead of the circuit board CB in a one-to-one manner.

The first embodiment of the present invention can provide a tiling display device having a minimized bezel area NA because the area in which the open hole OH is formed does not need to be separately allocated outside the display area AA, unlike the structures shown in FIGS. 3 and 5.

Hereinafter, a detailed example of the display module configuring a tiling display device according to the first embodiment of the present invention is described with reference to the accompanying drawings.

Figure 8:
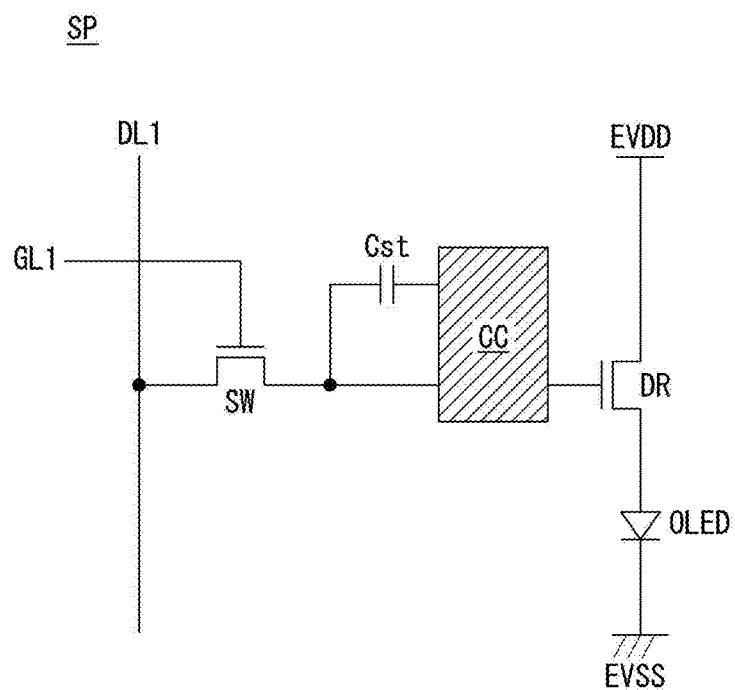
FIG. 8 shows a schematic circuit configuration of a subpixel.
Figure 9:
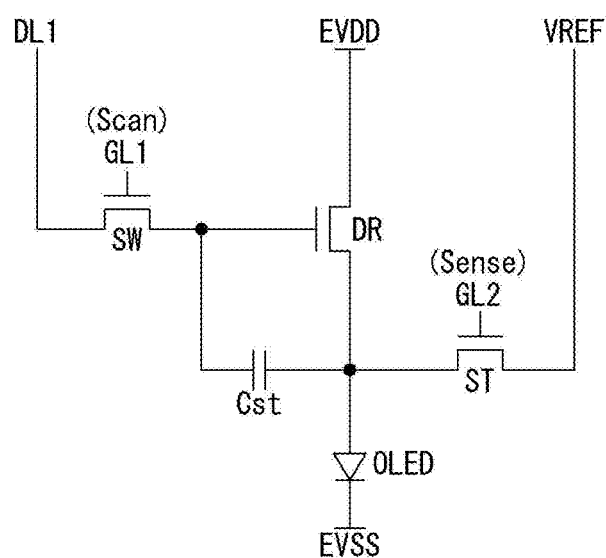
FIG. 9 illustrates a detail circuit configuration of a subpixel.
Figure 10:
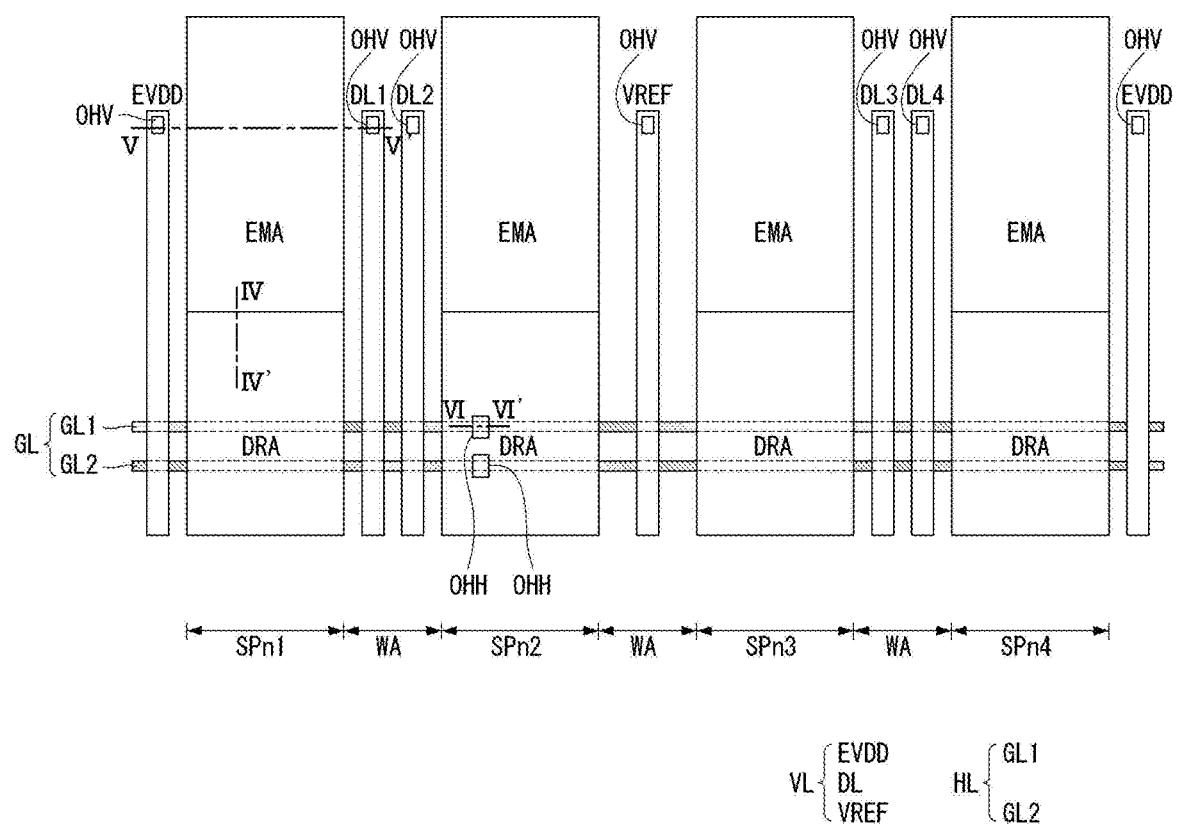
FIG. 10 is a diagram schematically showing a plane layout of subpixels configuring one pixel.
Figure 11:
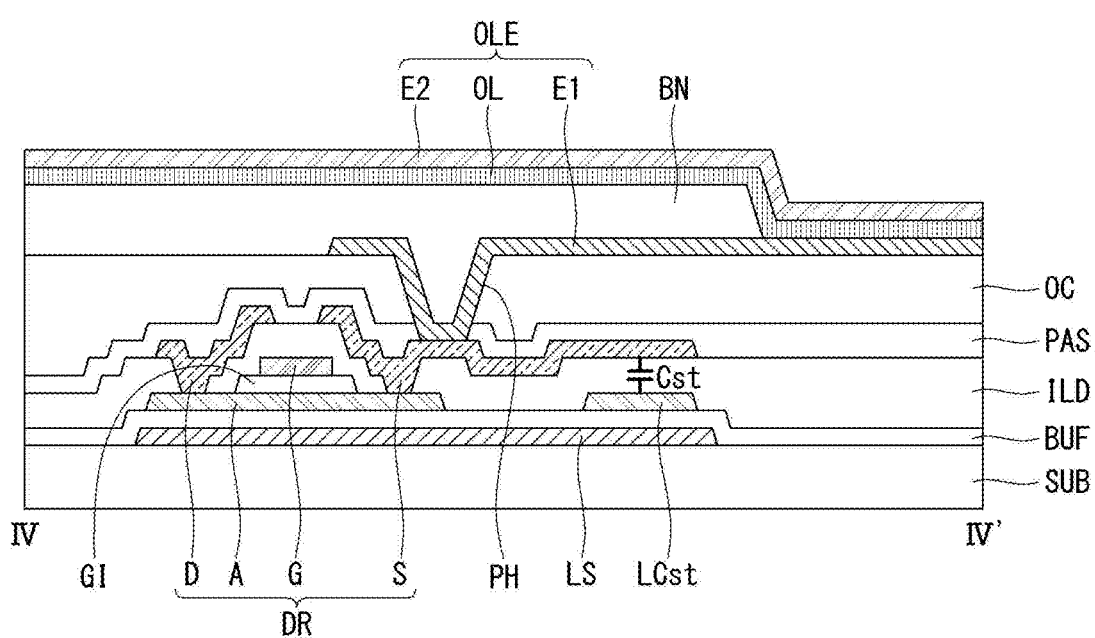
FIG. 11 is a cross-sectional view of FIG. 10 taken along line IV-IV'.
Figure 12:
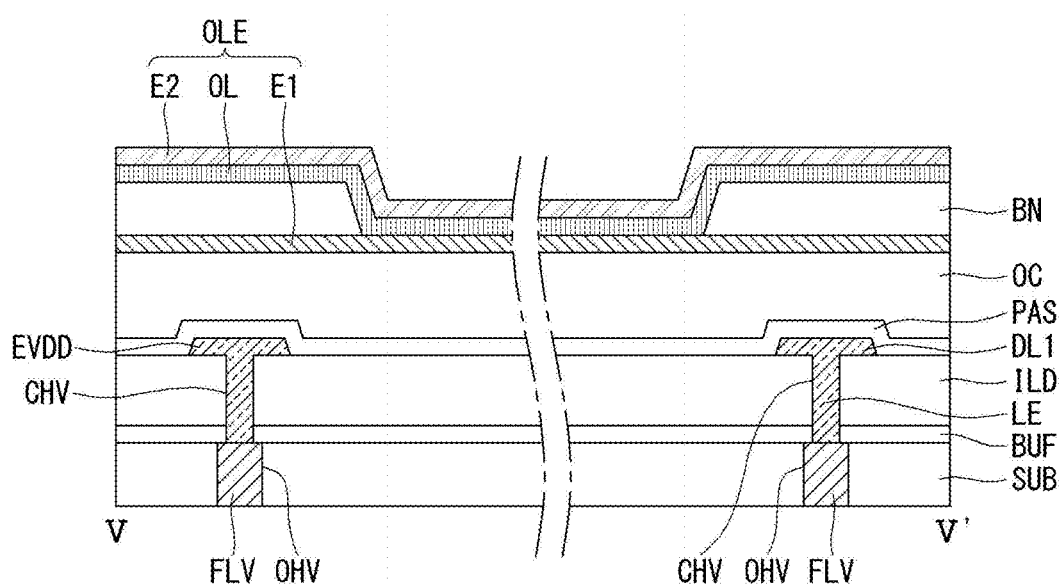
FIG. 12 is a cross-sectional view of FIG. 10 taken along line V-V'.
Figure 13A:
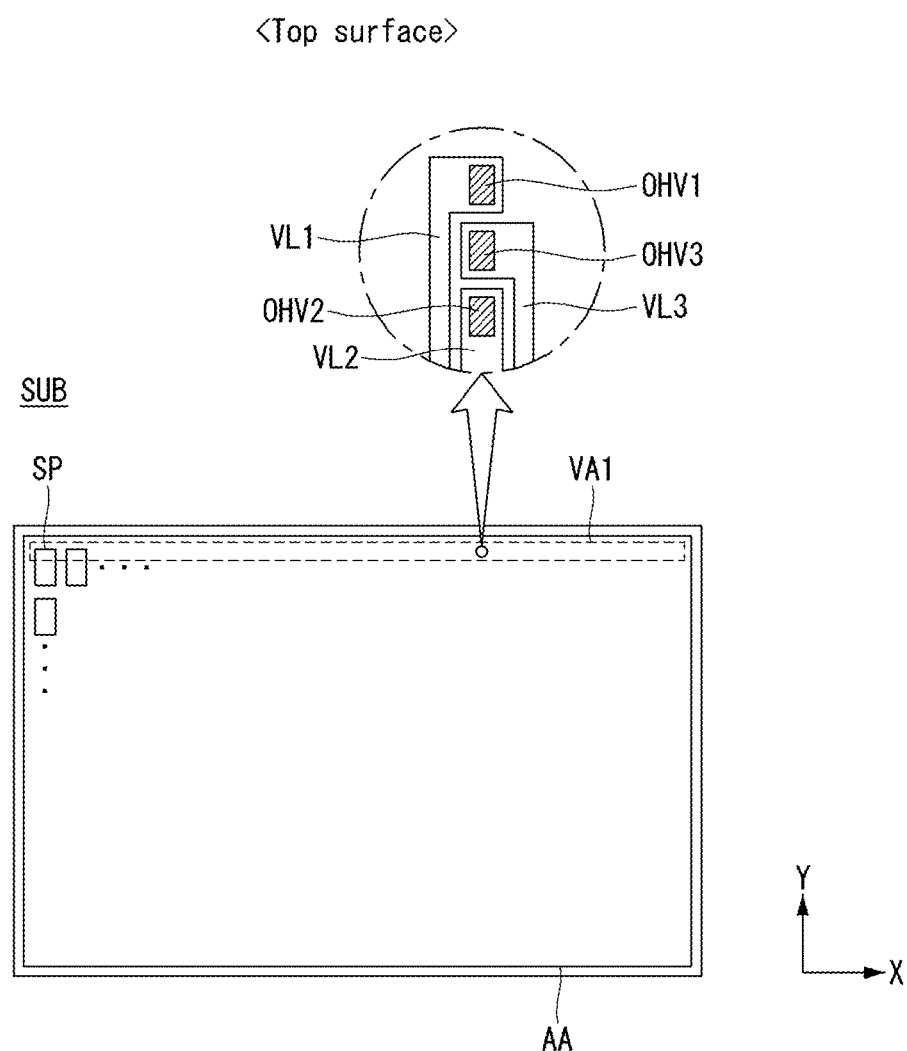
FIGS. 13A and 13B show exemplary diagrams showing the area in which a first open hole is formed.
Figure 13B:
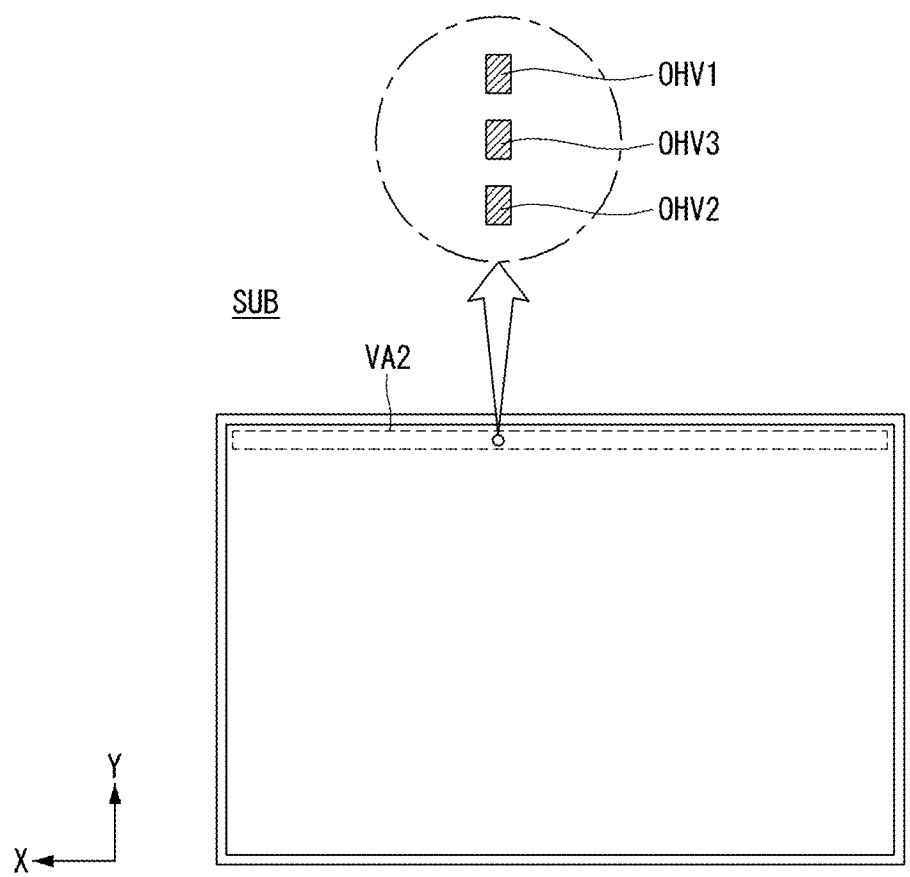
Figure 14:
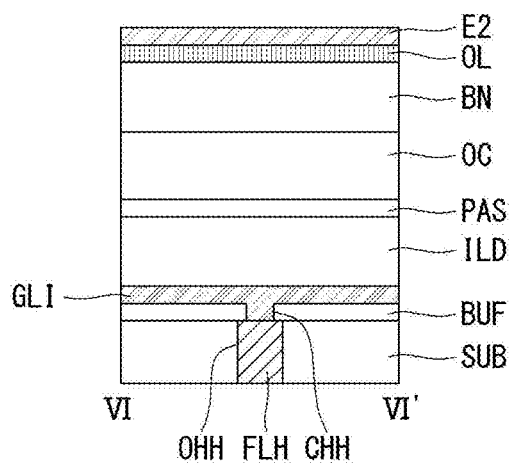
FIG. 14 is a cross-sectional view of FIG. 10 taken along line VI-VI'.
Figure 15A:
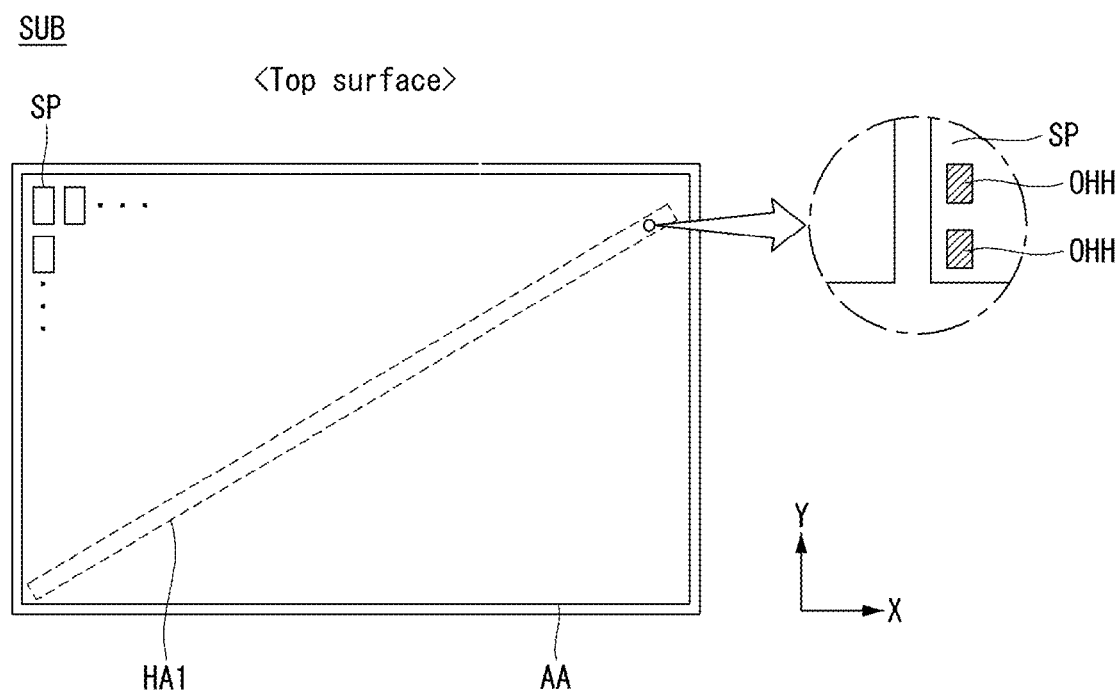
FIGS. 15A and 15B show exemplary diagrams showing the area in which a second open hole is formed.
Figure 15B:
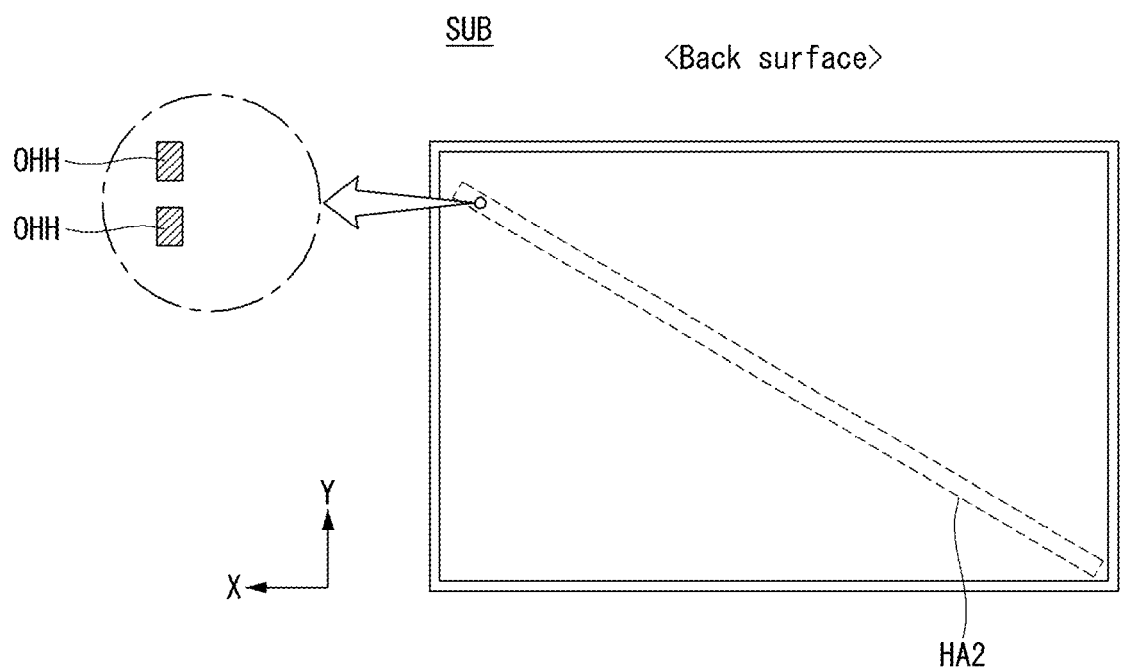

FIG. 8 shows a schematic circuit configuration of a subpixel. FIG. 9 illustrates a detail circuit configuration of a subpixel. FIG. 10 is a diagram schematically showing a plane layout of subpixels configuring one pixel. FIG. 11 is a cross-sectional view of FIG. 10 taken along line IV-IV'. FIG. 12 is a cross-sectional view of FIG. 10 taken along line V-V'. FIGS. 13A and 13B show exemplary diagrams showing the area in which a first open hole is formed. FIG. 14 is a cross-sectional view of FIG. 10 taken along line VI-VI'. FIGS. 15A and 15B show exemplary diagrams showing the area in which a second open hole is formed.

Referring to FIG. 8, one subpixel includes a switching transistor SW, a drive transistor DR, a capacitor Cst, a compensation circuit CC, and an OLED.

The switching transistor SW performs a switching operation in response to a scan signal supplied through a first gate line GL1 so that a data signal supplied through a data line DL1 is stored in the capacitor Cst as a data voltage. The drive transistor DR operates so that a drive current flows between a power line EVDD (high potential voltage) and a cathode power line EVSS (low potential voltage) in response to the data voltage stored in the capacitor Cst. The OLED operates to emit light in response to the drive current formed by the drive transistor DR.

The compensation circuit CC is a circuit added to the subpixel in order compensate for a threshold voltage, etc. of the drive transistor DR. The compensation circuit CC is configured with one or more transistors. The configuration of the compensation circuit CC is very various depending on an external compensation method, and an example thereof is described below.

As shown in FIG. 9, the compensation circuit CC includes a sensing transistor ST and a sensing line VREF (or reference line). The sensing transistor ST is connected between the source electrode of the drive transistor DR and the anode electrode of the OLED (hereinafter referred to as a "sensing node"). The sensing transistor ST operates to supply the sensing node of the drive transistor DR with an initialization voltage (or sensing voltage) delivered through the sensing line VREF or to sense a voltage or current of the sensing node of the drive transistor DR or the sensing line VREF.

The switching transistor SW has a drain electrode connected to the first data line DL1 and a source electrode connected to the gate electrode of the drive transistor DR. The drive transistor DR has a drain electrode connected to the power line EVDD and a source electrode connected to the anode electrode of the OLED. The capacitor Cst has a first capacitor electrode connected to the gate electrode of the drive transistor DR and a second capacitor electrode connected to the anode electrode of the OLED. The OLED has the anode electrode connected to the source electrode of the drive transistor DR and a cathode electrode connected to a second power line EVSS. The sensing transistor ST has a drain electrode connected to the sensing line VREF and a source electrode connected to the anode electrode of the OLED, that is, a sensing node, and the source electrode of the drive transistor DR. The transistor has been illustrated as being implemented as an n type, but is not limited thereto.

The operation time of the sensing transistor ST may be similar to or identical with or different from that of the switching transistor SW depending on an external compensation algorithm (or the configuration of the compensation circuit). For example, the switching transistor SW may have a gate electrode connected to the first gate line GL1, and the sensing transistor ST may have a gate electrode connected to a second gate line GL2. In this case, a scan signal Scan is delivered to the first gate line GL1, and a sensing signal Sense is delivered to the second gate line GL2. For another example, the first gate line GL1 connected to the gate electrode of the switching transistor SW and the second gate line GL2 connected to the gate electrode of the sensing transistor ST may be connected to be shared.

The sensing line VREF may be connected to the data driver. In this case, the data driver may sense the sensing node of a corresponding subpixel during the non-display period or an N frame (N is an integer of 1 or more) period of a real-time image, and may generate the results of the sensing. The switching transistor SW and the sensing transistor ST may be turned on at the same time. In this case, a sensing operation through the sensing line VREF and a data output operation of outputting a data signal based on the time division method of the data driver are separated (or divided).

In addition, a compensation target according to the results of sensing may be a data signal of a digital form, a data signal of an analog form or a gamma. Furthermore, the compensation circuit configured to generate a compensation signal (or compensation voltage, etc.) based on the results of sensing may be implemented within the data driver, within the timing controller or as a separate circuit.

In addition, in FIG. 9, a subpixel having a 3-transistor 1-capacitor (3T1C) structure including the switching transistor SW, the drive transistor DR, the capacitor Cst, the OLED, and the sensing transistor ST has been illustrated, but may be configured as a 3T2C, a 4T2C, a 5T1C, a 6T2C or the like if the compensation circuit CC is added. Hereinafter, an example in which a subpixel has the 3T 10 structure is described, for convenience of description.

Referring further to FIG. 10, a first subpixel SPn1 to a fourth subpixel SPn4, each one having an emission area EMA and a circuit area DRA, are formed in the display area AA of the substrate SUB. An OLED is formed in the emission area EMA. A circuit, including switching, sensing and drive transistors for driving the OLED, is formed in the circuit area DRA.

In each of the first subpixel SPn1 to the fourth subpixel SPn4, the OLED positioned in the emission area EMA emits light in response to the operation of the switching and drive transistors disposed in the circuit area DRA. "WA" positioned between the first subpixel SPn1 to the fourth subpixel SPn4 is the area in which signal lines are disposed. Vertical lines VL, such as a power line EVDD, a sensing line VREF, and first to fourth data lines DL1~DL4, are disposed in the area WA. The vertical lines VL may refer to lines that extend in a first direction (e.g., Y-axis direction) while intersecting between adjacent subpixels. Horizontal lines HL, such as first and second gate lines GL1 and GL2, are disposed to cross the vertical lines VL. The horizontal lines HL may refer to lines extending in a second direction (e.g., X-axis direction) crossing the first direction.

In some embodiments, lines, such as the power line EVDD, the sensing line VREF, and the first to fourth data lines DL1~DL4, may be electrically connected through a contact hole (or via hole) penetrating an insulating layer positioned between the lines although electrodes configuring a thin film transistor are disposed in different layers. Although not shown, the sensing line VREF may be connected to the sensing transistor of each of the first to fourth subpixels SPn1~SPn4 through a sensing connection line (or sensing jumping line). The power line EVDD may be connected to the drive transistor of each of the first to fourth subpixels SPn1~SPn4 through a power connection line (or power jumping line). The first and second gate lines GL1 and GL2 may be connected to the respective sensing and switching transistors of the first to fourth subpixels SPn1~SPn4. The first to fourth data lines DL1~DL4 may be connected to the switching transistors of corresponding subpixels SPn1, SPn2, SPn3, and SPn4.

Referring to FIG. 11, a light shielding layer LS is positioned on the substrate SUB. The light shielding layer LS functions to block the incidence of external light in order to prevent a photocurrent from occurring in a transistor. A buffer layer BUF is positioned on the light shielding layer LS. The buffer layer BUF functions to protect a TFT, formed in a subsequent process, against impurities such as alkali ions drained from the light shielding layer LS. The buffer layer BUF may be a silicon oxide (SiOx) layer, a silicon nitride (SiNx) layer or a multi-layer thereof.

The semiconductor layer A of the drive transistor DR is positioned on the buffer layer BUF. A capacitor lower electrode LCst spaced apart from the semiconductor layer A is positioned on the buffer layer BUF. The semiconductor layer A and the capacitor lower electrode LCst may be made of a silicon semiconductor or an oxide semiconductor. The silicon semiconductor may include amorphous silicon or crystallized polycrystalline silicon. The semiconductor layer A includes a drain area and source area including p type or n type impurities, and includes a channel between the drain area and the source area. The capacitor lower electrode LCst may be doped with impurities, thus becoming conductive.

A gate insulating film GI is positioned on the semiconductor layer A. The gate insulating film GI may be a silicon oxide (SiOx) layer, a silicon nitride (SiNx) layer or a multi-layer thereof. A gate electrode G is positioned in a given area of the semiconductor layer A on the gate insulating film GI, that is, at a position corresponding to a channel if impurities have been implanted. The gate electrode G may be made of any one selected from the group consisting of molybdenum (Mo), aluminum (Al), chrome (Cr), gold (Au), titanium (Ti), nickel (Ni), neodymium (Nd), and copper (Cu) or an alloy thereof. Furthermore, the gate electrode G may be a layer made of any one selected from the group consisting of molybdenum (Mo), aluminum (Al), chrome (Cr), gold (Au), titanium (Ti), nickel (Ni), neodymium (Nd), and copper (Cu) or a multi-layer made of an alloy thereof. For example, the gate electrode G may be a dual layer of molybdenum/aluminum-neodymium or molybdenum/aluminum.

An interlayer dielectric layer ILD insulating the gate electrode G is positioned on the gate electrode G. The interlayer dielectric layer ILD may be a silicon oxide (SiOx) film, a silicon nitride (SiNx) film or a multi-layer thereof. A source electrode S and a drain electrode D are positioned on the interlayer dielectric layer ILD. The source electrode S and the drain electrode D are connected to the semiconductor layer A through a contact hole through which the source area of the semiconductor layer A is exposed. The source electrode S and the drain electrode D may be a single layer or a multi-layer. If the source electrode S and the drain electrode D have a single layer, the single layer may be made of any one selected from the group consisting of molybdenum (Mo), aluminum (Al), chrome (Cr), gold (Au), titanium (Ti), nickel (Ni), neodymium (Nd), and copper (Cu) or an alloy thereof. Furthermore, if the source electrode S and the drain electrode D have a multi-layer, the multi-layer may be a dual layer of molybdenum/aluminum-neodymium or a triple layer of titanium/aluminum/titanium, molybdenum/aluminum/molybdenum or molybdenum/aluminum-neodymium/molybdenum. Accordingly, the drive transistor DR, including the semiconductor layer A, the gate electrode G, the source electrode S, and the drain electrode D is configured. Furthermore, the capacitor lower electrode LCst and the capacitor upper electrode constitute a capacitor Cst. The capacitor lower electrode LCst may be formed on the same layer as the semiconductor layer A, and the capacitor upper electrode may be a portion of the source electrode S.

A passivation film PAS is positioned over the substrate SUB including the drive transistor DR and the capacitor Cst. The passivation film PAS is an insulating film to protect an underlying element, and may be a silicon oxide (SiOx) film, a silicon nitride (SiNx) film or a multi-layer thereof. An overcoat layer OC is positioned on the passivation film PAS. The overcoat layer OC may be a planarization film for reducing the step of the underlying structure, and is made of an organic matter, such as polyimide, benzocyclobutene series resin or acylate. A pixel contact hole PH through which the source electrode S is exposed by exposing the passivation film PAS is formed in some area of the overcoat layer OC.

An OLED includes a first electrode E1, an organic emission layer OL, and a second electrode E2 which face each other.

The first electrode E1 may be an anode. The first electrode E1 is connected to the source electrode S of the drive transistor DR through the pixel contact hole PH penetrating the overcoat layer OC and the passivation film PAS. The first electrode E1 may be made of a transparent conductive material, such as indium tin oxide (ITO), indium zinc oxide (IZO) or zinc oxide (ZnO), in accordance with an adopted emission method, and may act as a transmission electrode. Alternatively, the first electrode may include a reflection layer and act as a reflection electrode. The reflection layer may be made of aluminum (Al), copper (Cu), silver (Ag), nickel (Ni) or an alloy thereof, and may be made of a silver/palladium/copper (APC) alloy, for example.

A bank layer BN is disposed over the substrate SUB in which the first electrode E1 has been formed. The bank layer BN may be made of n organic matter, such as polyimide, benzocyclobutene series resin or acylate. The bank layer BN includes an opening through which most of the first electrode E1 is exposed. The bank layer BN exposes the central part of the first electrode E1, but may be positioned to cover the side end of the first electrode E1.

The organic emission layer OL is disposed over the substrate SUB in which the bank layer BN has been formed. The organic emission layer OL is a layer in which electrons and holes are combined to emit light. The organic emission layer OL includes an emission layer EML, and may further include any one or more of a hole injection layer (HIL), a hole transport layer (HTL), an electron transport layer (ETL), and an electron injection layer (EIL).

The second electrode E2 is positioned on the organic emission layer OL. The second electrode E2 may be widely formed on the entire surface of the substrate SUB. The second electrode E2 may act as a transmission electrode or a reflection electrode in accordance with an adopted emission method. If the second electrode E2 is a transmission electrode, the second electrode E2 may be made of a transparent conductive material, such as indium tin oxide (ITO) indium zinc oxide (IZO), and may be made of magnesium (Mg), calcium (Ca), aluminum (Al), silver (Ag) or an alloy thereof having a thin thickness to the extent that light can pass through the second electrode.

Referring to FIG. 12, the substrate SUB includes first open holes OHV and first filling layers FLV formed in the display area AA. The first open hole OHV may be positioned between adjacent subpixels. The first open hole OHV may be formed to penetrate the substrate SUB. The first filling layer FLV fills the inside of the first open hole OHV. The first filling layer FLV is made of a conductive material.

The first filling layers FLV are electrically connected to vertical lines VL, such as the power line EVDD, the data line DL, and the sensing line VREF. To this end, first contact holes CHV, each one exposing the first filling layer FLV are formed. First contact holes CHV penetrate at least one insulating layer interposed between the vertical line VL and the first filling layer FLV. The vertical lines VL may be electrically connected to a corresponding first filling layer FLV through the first contact hole CHV. For example, as shown, the power line EVDD may be connected to a corresponding first filling layer FLV through the first contact hole CHV penetrating the buffer layer BUF and the interlayer dielectric layer ILD. The data line DL may be connected to a corresponding first filling layer FLV through the first contact hole CHV penetrating the buffer layer BUF and the interlayer dielectric layer ILD.

Referring to FIGS. 13A and 13B, an area VA in which the first open hole OHV is positioned may be provided in an area corresponding to one end and/or the other end of vertical lines VL within the display area AA. The vertical line VL and the first open hole OHV may correspond to each other in a one-to-one manner, but the present invention is not limited thereto. FIG. 13A is an exemplary diagram showing an area VA1 in which the first open hole OHV is disposed in the top surface of the substrate SUB. FIG. 13B is an exemplary diagram showing an area VA2 in which the first open hole OHV is positioned in the back surface of the substrate SUB.

The first open hole OHV may have a wider area than the width of the vertical lines VL in order to prevent a contact failure. The first open holes OHV need to be spaced apart by a preset amount in order to prevent a process failure. In this case, if all the first open holes OHV disposed at one end or the other end of the vertical lines VL extending in the first direction are disposed in parallel in the second direction, the area in which the first open holes OHV will be formed may be insufficient. In order to prevent this problem, in at least one area, a plurality of first open holes OHV1, OHV2, and OHV3 may be arranged in parallel in the first direction as shown. Vertical lines VL (e.g., VL1, VL2, and VL3) extended from the plurality of first open holes OHV1, OHV2, and OHV3 arranged in the first direction may make a detour and extend so that they do not intersect other vertical lines.

Referring to FIG. 14, the substrate SUB includes second open holes OHH and second filling layers FLH formed in the display area AA. The second open hole OHH may be formed between adjacent subpixels and may be formed in the circuit area of a predetermined subpixel. The second open holes OHH are formed to penetrate the substrate SUB. The second filling layer FLH fills the inside of the second open hole OHH. The second filling layer FLH is made of a conductive material.

The second filling layers FLH are electrically connected to horizontal lines HL, such as first and second gate lines GL1 and GL2. To this end, a second contact hole CHH exposing the second filling layer FLH through at least one insulating layer interposed between the horizontal line HL and the second filling layers FLH is formed. The horizontal lines HL may be electrically connected to a corresponding second filling layer FLH through the second contact hole CHH. For example, as shown, the first gate line GL1 may be connected to a corresponding second filling layer FLH through the second contact hole CHH penetrating the buffer layer BUF.

Referring to FIGS. 15A and 15B, an area HA in which the second open hole OHH is positioned may be provided in an area corresponding to one end and/or the other end of the horizontal lines HL within the display area AA. Alternatively, as shown, the area HA in which the second open hole OHH is positioned may be provided in a diagonal direction. The horizontal line HL and the second open hole OHH may correspond to each other in a one-to-one manner, but the present invention is not limited thereto. FIG. 15A is an exemplary diagram showing an area HA1 in which the second open hole OHH is positioned in the top surface of the substrate SUB. FIG. 15B is an exemplary diagram showing an area HA2 in which the second open hole OHH is positioned in the back surface of the substrate SUB.

Second Embodiment

Figure 16:
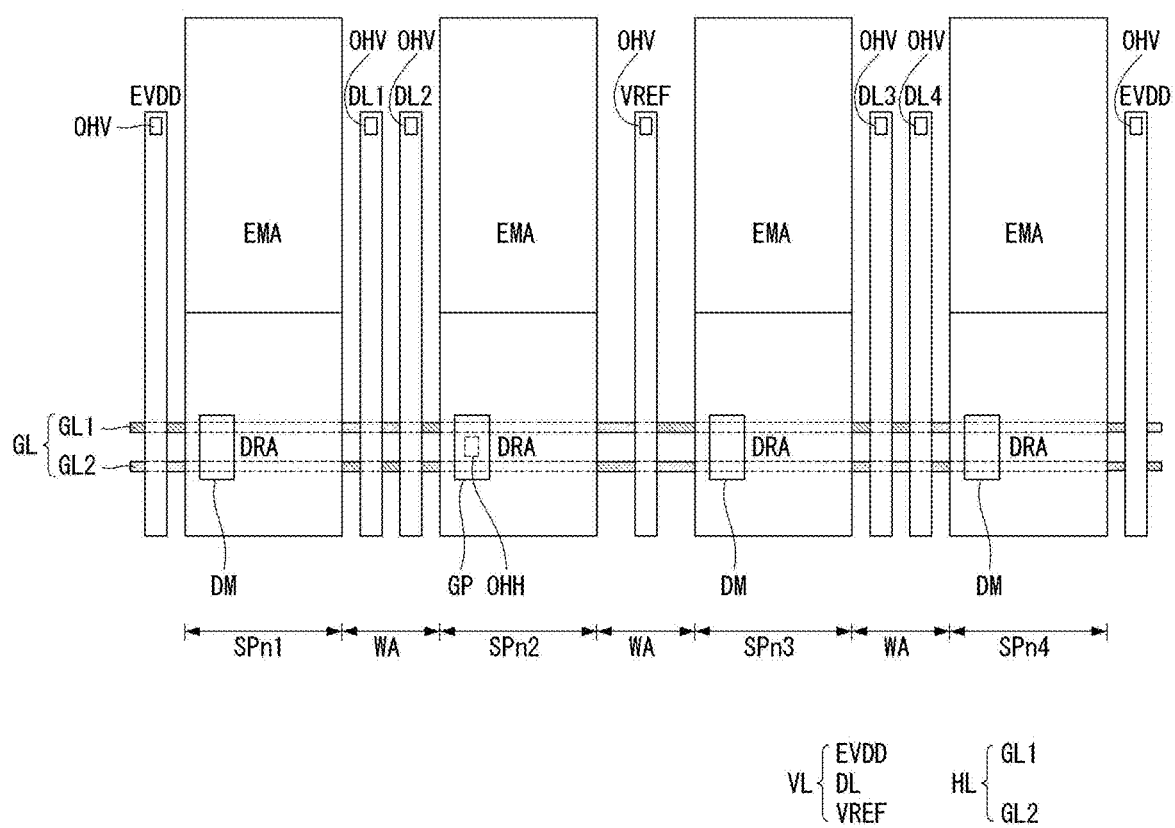
FIG. 16 relates to a tiling display device according to a second embodiment and is a diagram schematically showing a plane layout of subpixels configuring one pixel.
Figure 17:
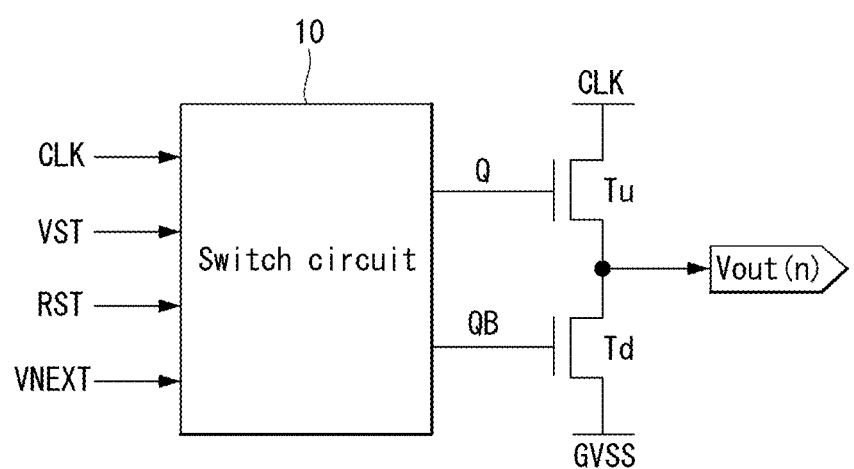
FIG. 17 is a diagram schematically showing one stage in which the shift register of a gate in panel (GIP) circuit outputs a gate pulse.
Figure 18:
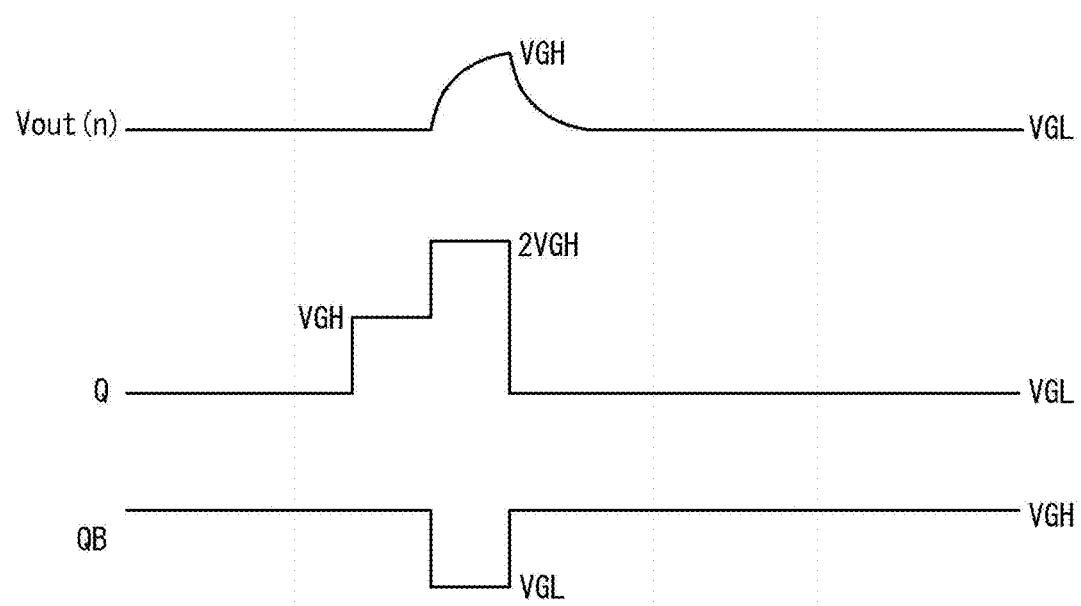
FIG. 18 is a waveform showing an operation example of the stage shown in FIG. 17.

FIG. 16 relates to a tiling display device according to a second embodiment and is a diagram schematically showing a plane layout of subpixels configuring one pixel. FIG. 17 is a diagram schematically showing one stage in which the shift register of a gate in panel (GIP) circuit outputs a gate pulse. FIG. 18 is a waveform showing an operation example of the stage shown in FIG. 17.

Referring to FIGS. 16 to 18, a gate driver according to a second embodiment of the present invention may include a level shifter (not shown) configured to convert a voltage of a gate timing signal from the timing controller (not shown) into a gate on voltage VGH and a gate off voltage VGL and a GIP circuit GP configured to output a scan pulse in response to a gate timing control signal received through the level shifter (not shown).

The GIP circuit GP is directly formed on the top surface of the substrate SUB in the display area AA. The timing controller and the level shifter may be formed in a circuit board provided on the back surface of the substrate SUB or a control board (not shown) connected to the circuit board. A gate timing control signal, that is, a start pulse, a shift clock, etc., necessary for the driving of the GIP circuit GP may be supplied to the GIP circuit GP through the filling layer FLH formed in the open hole OHH.

The GIP circuit GP may include a shift register to which stages sequentially generating output voltages are dependently connected. The GIP circuit GP receives a start pulse or a carry signal, received from a previous stage, as a start pulse, and generates an output when a clock is received.

As shown in FIGS. 17 and 18, each of stages may include a pull-up transistor Tu configured to raise an output voltage Vout(n) by charging an output terminal in response to a voltage of a Q node, a pull-down transistor Td configured to lower an output voltage by discharging the output terminal in response to a voltage of a QB node, and a switch circuit 10 configured to charge or discharge the Q node and the QB node. The output terminal of each of the stages is connected to corresponding gate lines GL1 and GL2.

The pull-up transistor Tu charges the output terminal up to the gate on voltage VGH of a shift clock CLK when the shift clock CLK is input to the drain of the pull-up transistor in the state in which the Q node has been pre-charged as much as the gate on voltage VGH. When the shift clock CLK is input to the drain of the pull-up transistor Tu, a voltage of the Q node floated through capacitance between the drain and gate of the pull-up transistor Tu rises as much as 2VGH by bootstrapping. At this time, the pull-up transistor Tu is turned on by the 2VGH voltage of the Q node, so a voltage of the output terminal rises up to the gate on voltage VGH. The pull-down transistor Td discharges the output voltage Vout(n) up to the gate off voltage VGL by supplying the gate off voltage VGL to the output terminal when a voltage of the QB node is charged by the gate on voltage VGH.

The switch circuit 10 charges the Q node in response to a start pulse received through a VST terminal or a carry signal received from a previous stage, and discharges the Q node in response to a signal received through an RST terminal or a VNEXT terminal. A reset signal for discharging the Q nodes of all the stages S(N−1), S(N), and S(N+1) at the same time is applied to the RST terminal. The carry signal generated from the next stage is applied to the VNEXT terminal. The switch circuit 10 may charge or discharge the QB node using an inverter on the contrary to the Q node. The structure of the GIP circuit GP applied to the present invention is not limited to the above description, and may include various known structures. The structure of the GIP circuit GP has been well known in the art, and thus a detailed description thereof is omitted.

According to the second embodiment of the present invention, the GIP circuit GP is used, but the GIP circuits GP are distributed and disposed within the display area AA, thereby being capable of minimizing the bezel area. For example, a single stage circuit generating one output in the GIP circuit GP may be distributed and disposed in multiple subpixels. The stage circuit and the gate line GL1 and GL2 may correspond to each other in a one-to-one way, but are not limited thereto.

A dummy circuit DM may be positioned in a subpixel in which a GIP circuit GP is not positioned. The dummy circuit DM has the same structure as the stage circuit, but does not generate an output. The second embodiment of the present invention can reduce a capacitance deviation between a subpixel in which the GIP circuit GP has been formed and a subpixel in which the GIP circuit GP has not been formed by forming the dummy circuit DM having the same structure as the GIP circuit GP. Accordingly, the second embodiment of the present invention has an advantage in that it can improve display quality while reducing the area of the bezel area.

Third Embodiment

Figure 19:
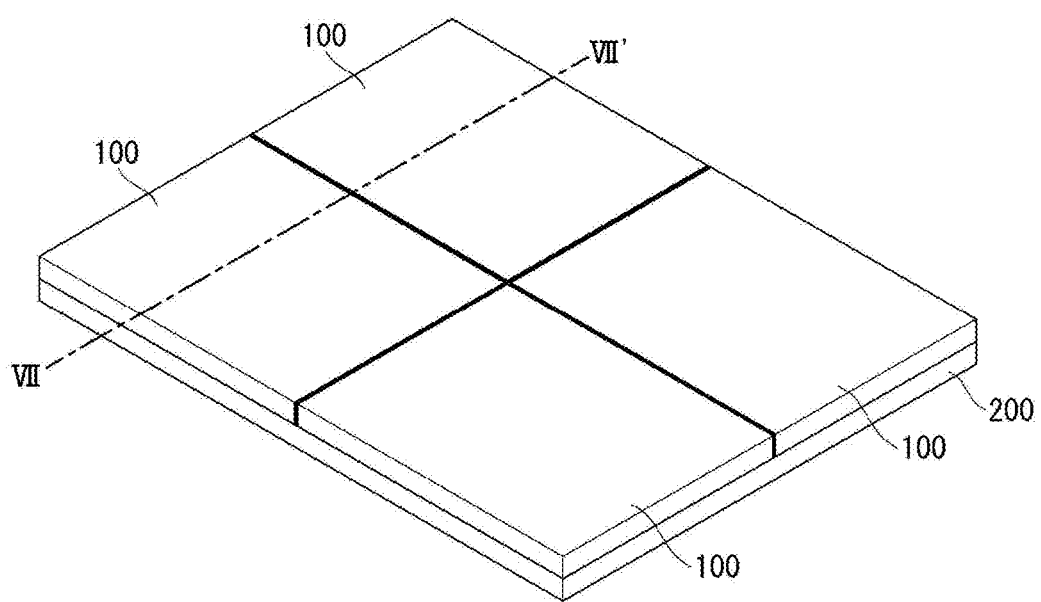
FIG. 19 is a perspective view schematically showing a tiling display device according to a third embodiment of the present invention.
Figure 20:
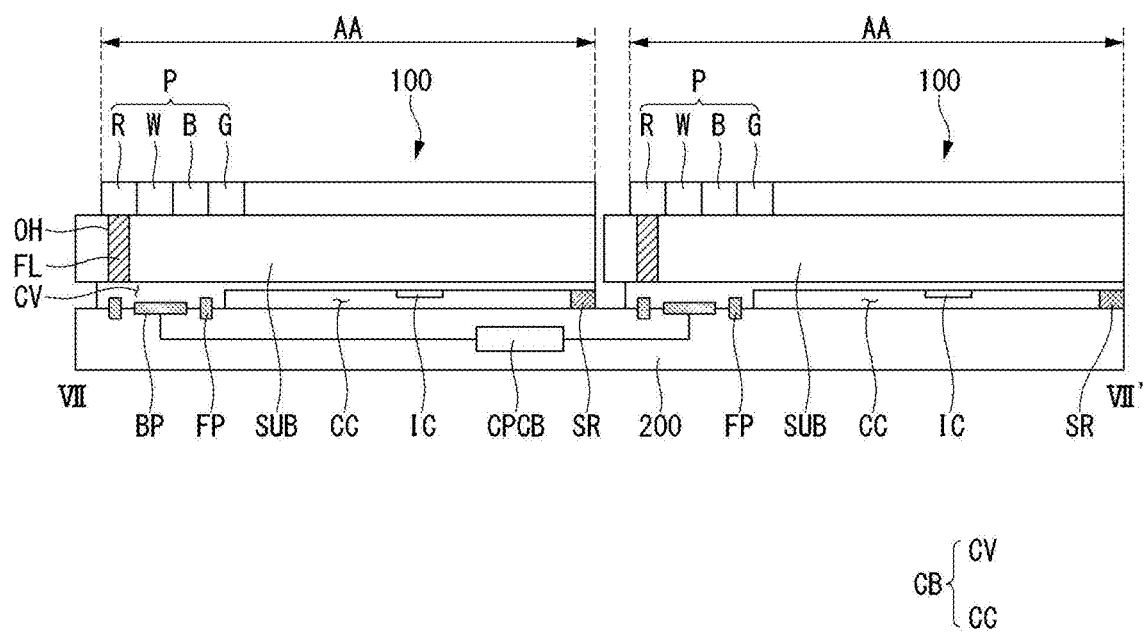
FIG. 20 is a cross-sectional view of FIG. 19 taken along line VII-VII'.

FIG. 19 is a perspective view schematically showing a tiling display device according to a third embodiment of the present invention. FIG. 20 is a cross-sectional view of FIG. 19 taken along line VII-VII'.

Referring to FIGS. 19 and 20, the tiling display device includes n (n is an integer of 2 or more) display modules 100 and a cabinet 200 positioned on the back surface of the display modules 100. The display modules 100 are arranged in parallel on one plane. That is, the display modules 100 are arranged in parallel so that respective display areas on which an image is displayed are directed toward one direction.

The display module 100 includes a substrate SUB and a circuit board CB positioned on the back surface of the substrate SUB. The circuit board CB may be bonded to the back surface of the substrate SUB through an adhesive and may maintain a fixed state. A drive IC IC is mounted on the circuit board CB. The drive IC IC is positioned on the circuit board CB in such a way as to not come into contact with the substrate SUB. That is, the circuit board CB includes one surface (or first surface) coming into contact with the substrate SUB and the other surface (or second surface) facing the one surface. The drive IC IC may be mounted on the other surface of the circuit board CB. Accordingly, the third embodiment of the present invention can prevent a problem in that elements disposed in the top surface of the substrate SUB are deteriorated by heat generated from the drive IC IC.

The cabinet 200 may be positioned on the back surface of the display modules 100 to control or fix a movement of the plurality of display modules 100. Each of the display modules 100 may be detachably coupled to the cabinet 200 through at least one fastening member FP. Accordingly, an embodiment of the present invention has an advantage in that any one display module 100 can be easily repaired when it fails because the display module 100 can be easily attached to or detached from the cabinet 200.

As described above, the drive IC IC may be positioned on the other surface of the circuit board CB. However, this is problematic because interference between the drive IC IC and the cabinet 200 may occur. In order to prevent this problem, the other surface of the circuit board CB may include a convex part CV and a concave part CC. The concave part CC has a shape in which the other surface of the circuit board CB is inward depressed partially, and thus has a given step with respect to the convex part CV. The drive IC IC is seated in the concave part CC and does not directly come into contact with the cabinet 200. Accordingly, an embodiment of the present invention has an advantage in that it can prevent a driving failure by blocking interference between the drive IC IC and the cabinet 200.

In this case, a compensation member SR for compensating for a gap between the concave part CC and the cabinet 200 may be further provided. The compensation member SR compensates for the gap between the concave part CC and the cabinet 200, but may function as a buffering member capable of reducing an external impact. The compensation member SR may be configured with a foam tape, but is not limited thereto.

A control board CPCB may be positioned in the cabinet 200. A timing controller for controlling timing of the driving unit may be formed in the control board CPCB. The control board CPCB is electrically connected to the circuit boards CB of the display modules 100 to supply a predetermined signal to each of the circuit boards CB. In order to connect the control board CPCB and the circuit board CB, a bump BP may be formed between the circuit board CB and the cabinet 200. The bump BP is interposed between the convex part CB of the circuit board CB and the cabinet 200, and may electrically connect the control board CPCB and the circuit board CB.

An embodiment of the present invention can provide a tiling display device having a minimized bezel area. Accordingly, the present invention has an advantage in that it can maximize a user's degree of immersion while providing visual information of high quality.

According to one or more embodiments of the present disclosure, a tiling display device, may comprise: a plurality of display modules arranged on one plane, wherein the display module comprises: a substrate comprising a display area in which subpixels are defined; a signal line positioned on a top surface of the substrate within the display area to deliver a predetermined signal to the subpixels; an open hole provided to penetrate the substrate within the display area; a filling layer filling the open hole; and a circuit board positioned on a back surface of the substrate and electrically connected to the signal line through the filling layer.

The open hole may be positioned between adjacent subpixels.

Each of the subpixels may comprise an emission area emitting light and a circuit area outside the emission area, and the open hole is positioned in the circuit area.

The tiling display device may further comprises: at least one insulating layer interposed between the substrate and the signal line; and a contact hole exposing the filling layer and provided to penetrate the at least one insulating layer, wherein the signal line is electrically connected to the filling layer through the contact hole.

The display module may comprise a gap in panel (GIP) circuit positioned on the substrate within the display area and configured to output a scan pulse to the signal line in response to a predetermined signal supplied through the filling layer. Further, the subpixels may comprise a first subpixel in which the GIP circuit is formed and a second subpixel in which the GIP circuit is not formed, and the second subpixel may comprise a dummy circuit having a structure identical with a structure of the GIP circuit.

The circuit board may comprise a first surface coming into contact with the substrate and a second surface facing the first surface, and the display module may comprise a drive IC mounted on the second surface of the circuit board. The second surface of the circuit board may comprise a concave part and a convex part having a given step, and the drive IC may be positioned in the concave part. The tiling display device may further comprise: a cabinet positioned on a back surface of the display module; and a compensation member configured to compensate for a gap between the cabinet and the concave part.

The tiling display device may further comprise: a cabinet positioned on a back surface of the display modules; and at least one fastening member configured to detachably couple the display module and the cabinet.

The tiling display device may further comprise: a cabinet positioned on a back surface of the display modules; a control board positioned within the cabinet; and a bump interposed between the cabinet and the circuit board to electrically connect the control board and the circuit board.

It will be apparent to those skilled in the art that various modifications and variations can be made in the tiling display device of the present disclosure without departing from the technical idea or scope of the disclosure. Thus, it is intended that the present disclosure cover the modifications and variations of this disclosure provided they come within the scope of the appended claims and their equivalents

What is claimed is:

1. A tiling display device, comprising:
a plurality of display modules arranged on one plane, wherein the display module comprises:
a substrate comprising a display area in which subpixels are defined;
a signal line positioned on a top surface of the substrate within the display area to deliver a predetermined signal to the subpixels;
an open hole provided to penetrate the substrate within the display area;
a filling layer filling the open hole; and
a circuit board positioned on a back surface of the substrate and electrically connected to the signal line through the filling layer,
wherein the display module comprises a gap in panel (GIP) circuit positioned on the substrate within the display area and configured to output a scan pulse to the signal line in response to a predetermined signal supplied through the filling layer,
wherein the subpixels comprise a first subpixel in which the GIP circuit is formed and a second subpixel in which the GIP circuit is not formed, and
wherein the second subpixel comprises a dummy circuit having a structure identical with a structure of the GIP circuit.

2. The tiling display device of claim 1, wherein the open hole is positioned between adjacent subpixels.

3. The tiling display device of claim 1, wherein:
each of the subpixels comprises an emission area emitting light and a circuit area outside the emission area, and
the open hole is positioned in the circuit area.

4. The tiling display device of claim 1, further comprising:
at least one insulating layer interposed between the substrate and the signal line; and
a contact hole exposing the filling layer and provided to penetrate the at least one insulating layer,
wherein the signal line is electrically connected to the filling layer through the contact hole.

5. The tiling display device of claim 1, wherein:
the circuit board comprises a first surface coming into contact with the substrate and a second surface facing the first surface, and
the display module comprises a drive IC mounted on the second surface of the circuit board.

6. The tiling display device of claim 5, wherein:
the second surface of the circuit board comprises a concave part and a convex part having a given step, and
the drive IC is positioned in the concave part.

7. The tiling display device of claim 6, further comprising:
a cabinet positioned on a back surface of the display module; and
a compensation member configured to compensate for a gap between the cabinet and the concave part.

8. The tiling display device of claim 1, further comprising:
a cabinet positioned on a back surface of the display modules; and
at least one fastening member configured to detachably couple the display module and the cabinet.

9. The tiling display device of claim 1, further comprising:
a cabinet positioned on a back surface of the display modules;
a control board positioned within the cabinet; and
a bump interposed between the cabinet and the circuit board to electrically connect the control board and the circuit board.

* * * * *